United States Patent
Ziren et al.

(10) Patent No.: US 7,177,602 B2
(45) Date of Patent: Feb. 13, 2007

(54) ELECTRONIC DEVICES HAVING AUTOMATIC FREQUENCY CONTROL SYSTEMS AND METHODS AND COMPUTER PROGRAM PRODUCTS FOR OPERATING THE SAME

(75) Inventors: Mikael Ziren, Malmö (SE); Jonas Ohlsson, Malmö (SE); Tatjana Hrnjez, Malmö (SE); Elias Jonsson, Malmö (SE); Bo Bernhardsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 432 days.

(21) Appl. No.: 10/457,913

(22) Filed: Jun. 10, 2003

(65) Prior Publication Data

US 2004/0058657 A1    Mar. 25, 2004

Related U.S. Application Data

(60) Provisional application No. 60/412,896, filed on Sep. 23, 2002.

(51) Int. Cl.
*H04B 1/40* (2006.01)
*H04B 1/04* (2006.01)
*H04B 1/18* (2006.01)
*H04B 7/00* (2006.01)

(52) U.S. Cl. .................. 455/75; 455/115.1; 455/192.2; 455/255

(58) Field of Classification Search .................. 455/75, 455/73, 550.1, 91, 95, 115.1, 130, 136, 164.2, 455/192.1, 192.2, 216, 255, 257, 334
See application file for complete search history.

(56) References Cited

U.S. PATENT DOCUMENTS

| | | | |
|---|---|---|---|
| 6,363,102 B1 * | 3/2002 | Ling et al. ................. | 375/147 |
| 6,606,487 B2 * | 8/2003 | Sternberg ................... | 455/257 |
| 6,785,513 B1 * | 8/2004 | Sivaprakasam ............ | 455/63.1 |
| 6,816,716 B2 * | 11/2004 | Shohara .................... | 455/196.1 |
| 6,856,791 B2 * | 2/2005 | Klemmer .................... | 455/76 |
| 2003/0114110 A1 | 6/2003 | Dahlback et al. .......... | 455/67.1 |

FOREIGN PATENT DOCUMENTS

| WO | WO 01/20862 A1 | 3/2001 |
|---|---|---|
| WO | WO 02/093748 A1 | 11/2002 |

* cited by examiner

*Primary Examiner*—Tony T. Nguyen

(57) ABSTRACT

An automatic frequency control (AFC) system in an electronic device is operated by using an AFC-algorithm component to determine a frequency error corresponding to a difference between a frequency of a signal output from a signal generator and a received signal frequency. The frequency error determined by the AFC-algorithm component is multiplied by a scaling factor, which is set to zero after an adjustment has been made to change a frequency of the signal output from the signal generator. The scaling factor is increased from zero to one over time. The scaled frequency error is used to determine whether to adjust the frequency of the signal output from the signal generator.

24 Claims, 7 Drawing Sheets

ELECTRONIC DEVICES HAVING AUTOMATIC FREQUENCY CONTROL SYSTEMS AND METHODS AND COMPUTER PROGRAM PRODUCTS FOR OPERATING THE SAME

RELATED APPLICATION

This application claims priority to and the benefit of Provisional Application No. 60/412,896, filed Sep. 23, 2002, the disclosure of which is hereby incorporated herein by reference.

BACKGROUND OF THE INVENTION

The present invention relates to communication methods and electronic devices, and, more particularly, to communication methods and electronic devices that use automatic frequency control (AFC) systems and methods.

Wireless communications systems are commonly used to provide voice and data communications to subscribers. For example, analog cellular radiotelephone systems, such as those designated AMPS, ETACS, NMT-450, and NMT-900, have long been deployed successfully throughout the world. Digital cellular radiotelephone systems such as those conforming to the North American standard IS-54 and the European standard GSM have been in service since the early 1990's. More recently, a wide variety of wireless digital services broadly labeled as PCS (Personal Communications Services) have been introduced, including advanced digital cellular systems conforming to standards such as IS-136, IS-95, and UMTS, lower-power systems such as DECT (Digital Enhanced Cordless Telephone) and data communications services such as CDPD (Cellular Digital Packet Data). These and other systems are described in The Mobile Communications Handbook, edited by Gibson and published by CRC Press (1996).

Several types of access techniques are conventionally used to provide wireless services to users of wireless systems. Traditional analog cellular systems generally use a system referred to as Frequency Division Multiple Access (FDMA) to create communications channels, wherein discrete frequency bands serve as channels over which cellular terminals communicate with cellular base stations. Typically, these bands are reused in geographically separated cells in order to increase system capacity.

Modern digital wireless systems typically use different multiple access techniques such as Time Division Multiple Access (TDMA) and/or Code Division Multiple Access (CDMA) to provide increased spectral efficiency. In TDMA systems, such as those conforming to the GSM or IS-136 standards, carriers are divided into sequential time slots that are assigned to multiple channels such that a plurality of channels may be multiplexed on a single carrier. CDMA systems, such as those conforming to the IS-95 and UMTS standards, achieve increased channel capacity by using "spread spectrum" techniques wherein a channel is defined by modulating a data-modulated carrier signal by a unique spreading code, i.e., a code that spreads an original data-modulated carrier over a wide portion of the frequency spectrum in which the communications system operates. The spreading code typically includes a sequence of "chips" occurring at a chip rate that is higher than the bit rate of the data being transmitted.

A so-called RAKE receiver structure is commonly used to recover information corresponding to one of the user data streams. In a typical RAKE receiver, a received composite signal is correlated with a particular spreading sequence assigned to the receiver to produce a plurality of time-offset correlations, a respective one of which corresponds to an echo of a transmitted spread spectrum signal. The correlations are then combined in a weighted fashion, i.e., respective correlations are multiplied by respective weighting factors and then summed to produce a decision statistic. The correlations are generally performed in a plurality of correlating fingers in the RAKE receiver, wherein each finger is synchronized with a channel path. The outputs of all fingers are combined to allow an improvement in the overall signal-to-noise ratio of the received signal. The design and operation of RAKE receivers are well known to those having skill in the art and need not be described further herein.

To maintain the RAKE receiver fingers synchronized with their respective channel paths, a path searcher may be used to support the RAKE receiver. The path searcher can continuously search for new channel paths and estimate their delays. These delays are then assigned to the RAKE fingers. For a wideband CDMA (WCDMA) system, the detection of the multi-path delays is typically done as a two-stage process: In the first stage, a wide search is done to identify the location of the multi-path delays. The resolution of this first search (i.e., the separation between the delays) is typically one chip or less. Typically, the received power or signal to interference ratio (SIR) is used as a criterion for the quality of the delayed signal. In the second stage, a localized search is performed over selected regions of delays. The resolution of this second search is typically one-half chip to an eighth of a chip. A decision is then made as to which delays to use for despreading the data based on the information from the localized search.

Referring now to FIG. 1, a conventional terrestrial cellular radiotelephone communication system 20 is illustrated. The cellular radiotelephone communication system 20 may include one or more radiotelephones (terminals) 22, communicating with a plurality of base stations 26 serving a plurality of cells 24 and a mobile telephone switching office (MTSO) 28. Although only three cells 24 are shown in FIG. 1, a typical cellular network may include hundreds of cells, may include more than one MTSO, and may serve thousands of radiotelephones.

The cells 24 generally serve as nodes in the communication system 20, from which links are established between radiotelephones 22 and the MTSO 28, by way of the base stations 26 serving the cells 24. Each cell 24 will have allocated to it one or more dedicated control channels and one or more traffic channels. A control channel is a dedicated channel used for transmitting cell identification and paging information. The traffic channels carry the voice and data information. Through the cellular network 20, a duplex radio communication link may be established between two mobile terminals 22 or between a mobile terminal 22 and a landline telephone user 32 through a Public Switched Telephone Network (PSTN) 34. The function of a base station 26 is to handle radio communication with mobile terminals 22 within the cells 24. In this capacity, a base station 26 functions as a relay station for data and voice signals.

It is generally desirable to ensure good frequency synchronization between a mobile terminal and a base station. Thus, a mobile terminal may include an automatic frequency control (AFC) block or component to keep the frequency difference between a base station and a mobile terminal within acceptable requirements for the system in question. In a Universal Mobile Telephone System (UMTS) using WCDMA, the frequency accuracy of the mobile terminal transmitter is specified to be within 0.1 ppm of a received base-station frequency, for example, around 200 Hz for a system operating at 2 GHz.

Referring now to FIG. 2, a conventional mobile terminal architecture 200 that includes an AFC component comprises a transceiver 210, an AFC-algorithm component 220, a conversion component 230, a digital-to-analog converter (DAC) 240, and a voltage controlled crystal oscillator (VCXO) 250, which are configured as shown. The AFC-algorithm component 220 generates an error signal responsive to an incoming signal received through the transceiver 210. The error signal is converted by the conversion block 230 into an appropriate digital adjustment signal for the DAC 240, which generates a new output voltage to adjust the frequency generated by the VCXO 250.

A mobile terminal may use different AFC algorithms depending on whether the frequency error is expected to be relatively large or small. Referring now to FIG. 3, a conventional AFC-algorithm component 300 that may be used when the frequency error is expected to be relatively small comprises averaging blocks 310a, 310b, and 310c respectively associated with fingers of a RAKE receiver, delay operators 320a, 320b, and 320c, multipliers 330a, 330b, and 330c, a summation component 340, an infinite impulse response (IIR) low pass filter 350, a conversion component 360, a multiplier 370, and an update decision component 380, which are configured as shown. In FIG. 3, S denotes received symbols, $S_{ref}$ denotes known pilot symbol references, and N is the number of symbols processed. As shown in FIG. 3, frequency error estimates are calculated for each RAKE receiver finger and combined by the summation component 340. The low pass filter 350 may be used to decrease the influence of Doppler variations in the frequency error. The conversion component 360 generates a frequency error signal by computing the arctan of the real portion of the signal output from the low pass filter 350 divided by the imaginary portion of the signal output from the low pass filter 350. The multiplier 370 is used to scale the frequency error signal output from the conversion component 360 with the signal $f_{res}$ to generate an error signal $f_e$ that may be used by the update decision component 380 to change the output voltage generated by a DAC for controlling a VCXO. In other implementations, separate frequency error measurements may be obtained from different base stations and a mean frequency error may be formed by weighting the frequency error measurements from the various base stations differently.

Referring now to FIG. 4, a conventional AFC-algorithm component 400 that may be used when the frequency error is expected to be relatively large comprises a read pilot symbol component 410, an estimation component 420, a zero-pad component 430, a fast fourier transform (FFT) component 440, an absolute value component 450, a summation component 460, a conversion component 470, a multiplier component 480, an update decision component 490, a frequency storage component 492, a summation component 494, and a comparator 496, which are configured as shown. For each slot, the read pilot symbol component 410 reads the pilot symbols which are used by the estimation component 420 to generate estimates where S denotes received symbols, $S_{ref}$ denotes known pilot symbol references, and * denotes complex conjugation. Components 430, 440, and 450 are used to generate a FFT of the estimates to convert to the frequency domain to generate an output that corresponds to the magnitude of the FFT squared. These values are summed by the summation component 460 and provided to the conversion component 470, which generates a frequency error signal by interpolating between adjacent frequencies associated with the maximum energy levels.

The multiplier 480 is used to scale the frequency error signal output from the conversion component 470 with the signal $f_{res}$ to generate an error signal $f_e$ that may be used by the update decision component 490 to change the output voltage generated by a DAC for controlling a VCXO. To determine whether to adjust the input signal to the DAC, the frequency storage component 492 stores the frequency that is associated with the maximum power level. The summation component 494 adds the power levels for the frequency associated with the maximum power and an adjacent and/or proximal frequency and provides this sum to the comparator 496. If the sum exceeds a threshold, then the update decision component 490 will adjust the input signal to the DAC so as to change the frequency generated by the VCXO.

Unfortunately, a DAC generally has limited precision. The resolution is typically equal to the analog-value range divided by $2^n$ bits, where n is the number of bits used for the digital input signal. The frequency resolution may be approximately 50–100 Hz in some implementations. This large quantization may lead to sudden frequency changes when the input signal to the DAC changes. In addition, a VCXO may experience frequency drift in response to temperature changes. The temperature may change, for example, when the mode of a user terminal (i.e., the on-off status of the mobile terminal) changes and/or when the mobile terminal processor load changes.

SUMMARY OF THE INVENTION

According to some embodiments of the present invention, an automatic frequency control (AFC) system in an electronic device is operated by using an AFC-algorithm component to determine a frequency error corresponding to a difference between a frequency of a signal output from a signal generator and a received signal frequency. The frequency error determined by the AFC-algorithm component is multiplied by a scaling factor, which is set to zero after an adjustment has been made to change a frequency of the signal output from the signal generator. The scaling factor is increased from zero to one over time. The scaled frequency error is used to determine whether to adjust the frequency of the signal output from the signal generator.

Although described above primarily with respect to method aspects of the present invention, it will be understood that the present invention may be embodied as methods, electronic devices, and/or computer program products.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
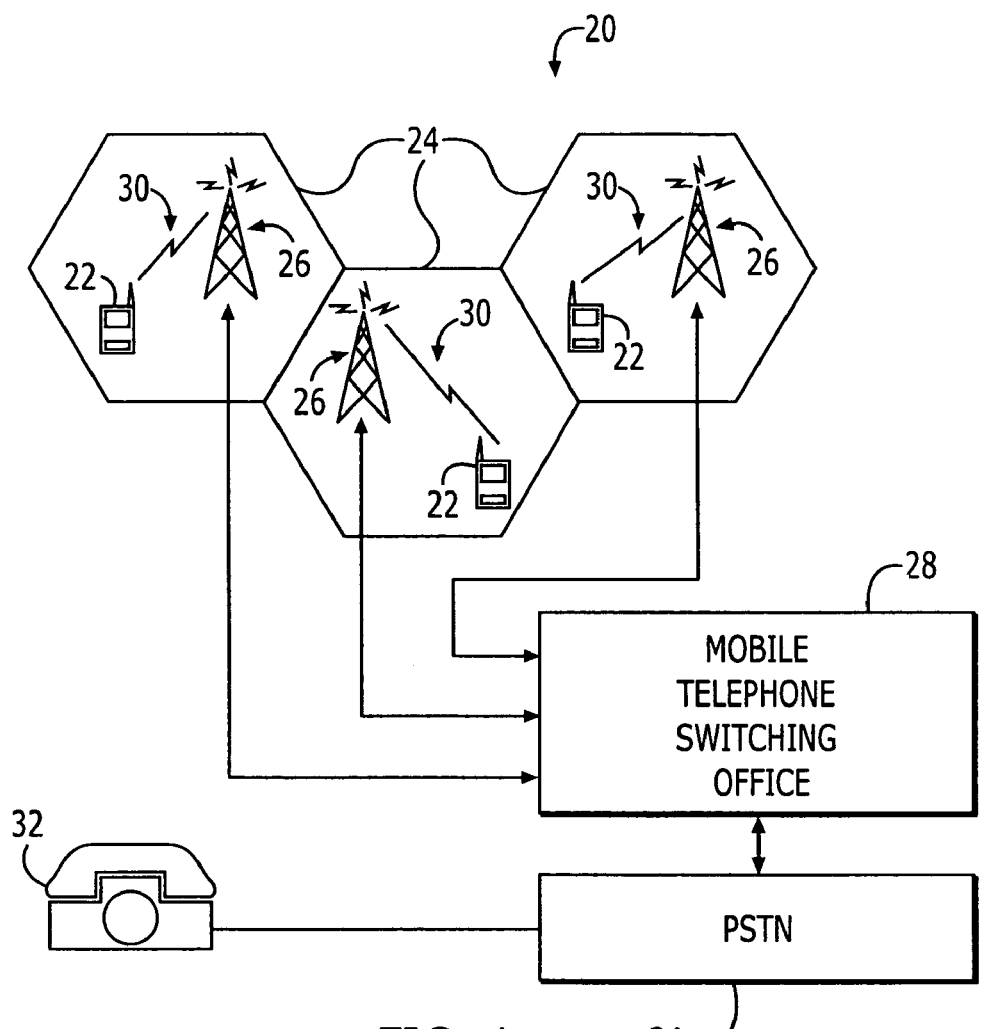
FIG. 1 is a block diagram that illustrates a conventional terrestrial radiotelephone communication system.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof.

The present invention may be embodied as systems, e.g., electronic devices, methods, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Figure 5:
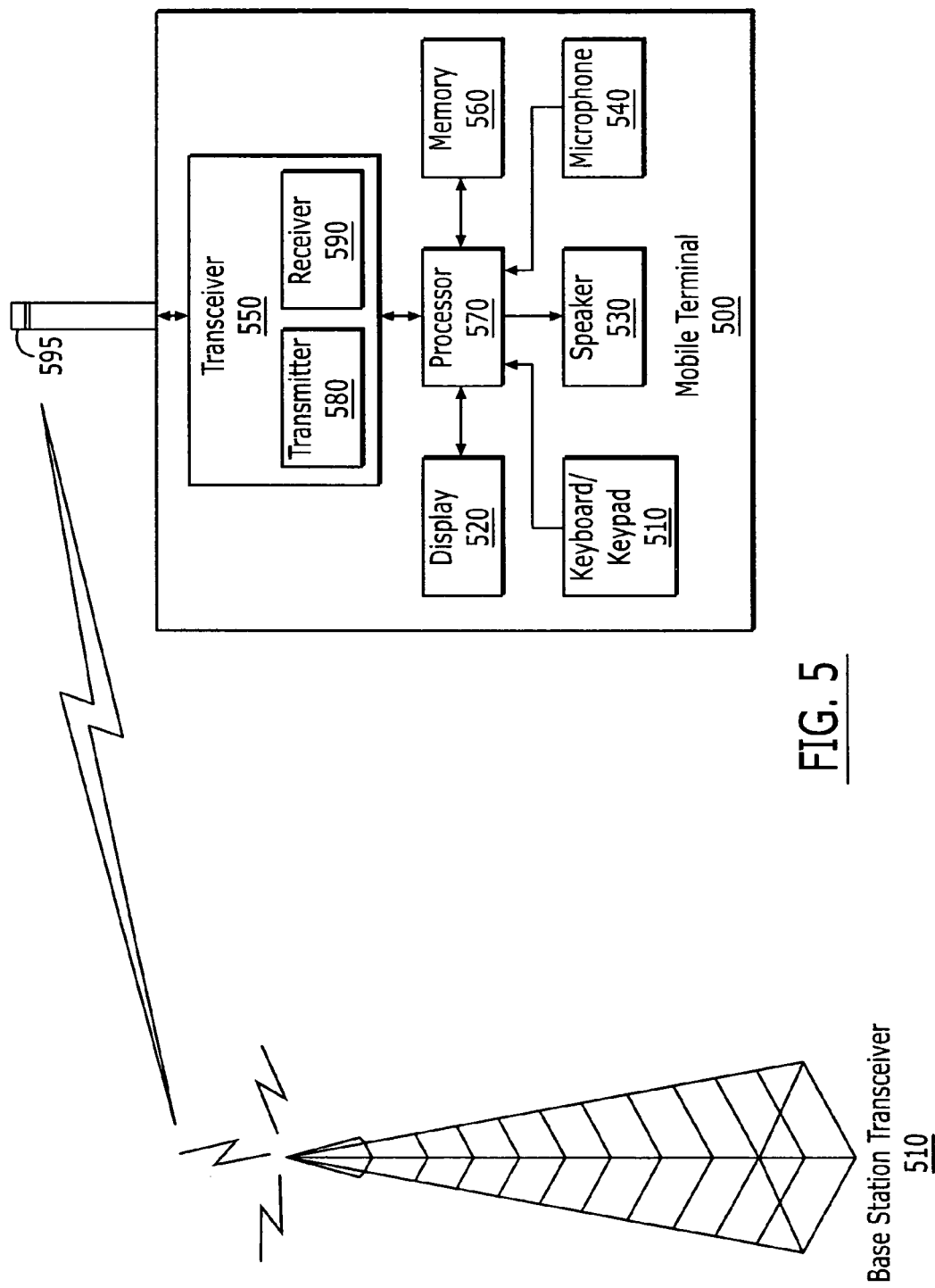
FIG. 5 is a schematic that illustrates exemplary radiotelephone communication systems in accordance with some embodiments of the present invention.

Referring now to FIG. 5, an exemplary radiotelephone communication system, in accordance with embodiments of the present invention, comprises a mobile terminal 500 and a base station transceiver 510. The mobile terminal 500 may comprise a keyboard/keypad 510, a display 520, a speaker 530, a microphone 540, a transceiver 550, and a memory 560 that communicate with a processor 570. The transceiver 550 typically comprises a transmitter circuit 580 and a receiver circuit 590, which respectively transmit outgoing radio frequency signals to the base station transceiver 510 and receive incoming radio frequency signals from the base station transceiver 510 via an antenna 595. The radio frequency signals transmitted between the mobile terminal 500 and the base station transceiver 510 may comprise both traffic and control signals (e.g., paging signals/messages for incoming calls), which are used to establish and maintain communication with another party or destination.

The foregoing components of the mobile terminal 500 may be included in many conventional mobile terminals and their functionality is generally known to those skilled in the art. Moreover, as used herein, the term "mobile terminal" may include a satellite or cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

The base station transceiver 510 comprises the radio transceiver(s) that define an individual cell in a cellular network and communicate with the mobile terminal 500 and other mobile terminals in the cell using a radio-link protocol. Although only a single base station transceiver 510 is shown, it will be understood that many base station transceivers may be connected through, for example, a mobile switching center and other devices to define a wireless communication network.

Although the present invention may be embodied in communication devices or systems, such as the mobile terminal 500 and/or the base station transceiver 510, the present invention is not limited to such devices and/or systems. Instead, the present invention may be embodied in any method, transmitter, communication device, communication system, or computer program product that incorporate automatic frequency control (AFC) systems, methods, and/or computer program products.

Figure 6:
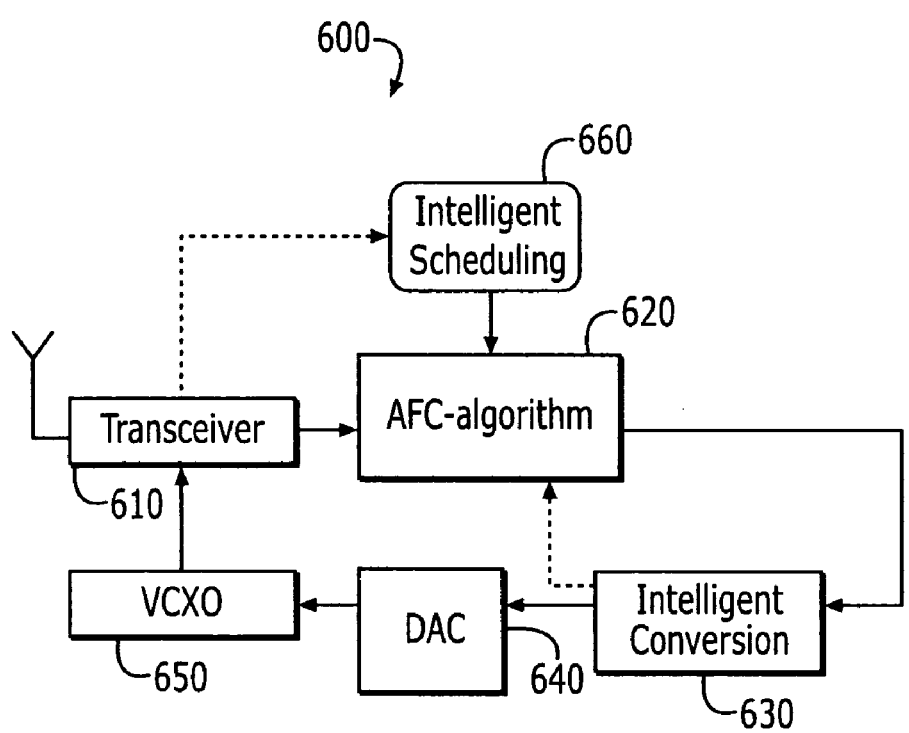
FIG. 6 is an AFC component that may be used in electronic devices and/or mobile terminals in accordance with some embodiments of the present invention.

Referring now to FIG. 6, an AFC component 600 that may be used in mobile terminals, such as the mobile terminal 500 of FIG. 5, for example, in accordance with some embodiments of the present invention, comprises a transceiver 610, an AFC-algorithm component 620, an intelligent conversion component 630, a digital-to-analog converter (DAC) 640, a voltage controlled crystal oscillator (VCXO) 650, and an intelligent scheduling component 660, which are configured as shown. The AFC-algorithm component 620 generates an error signal responsive to an incoming signal received through the transceiver 610. The error signal is converted by the intelligent conversion block 630 into an appropriate digital adjustment signal for the DAC 640, which generates a new output voltage to adjust the frequency generated by the VCXO 650.

Figure 3:
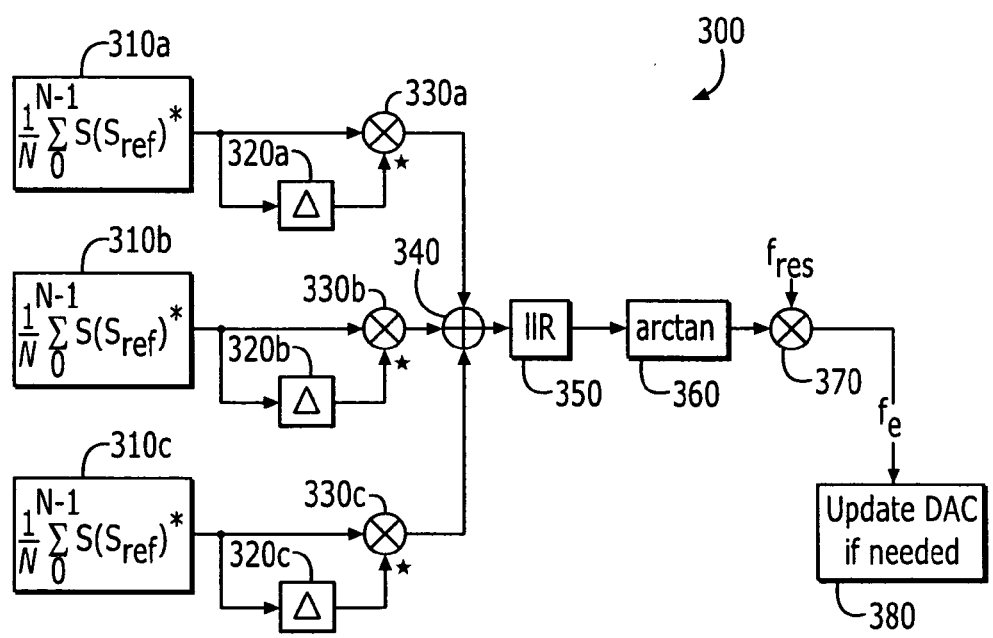
FIG. 3 is a block diagram that illustrates a conventional automatic frequency control (AFC)-algorithm component that may be used in an AFC system when a frequency error is expected to be relatively small.
Figure 4:
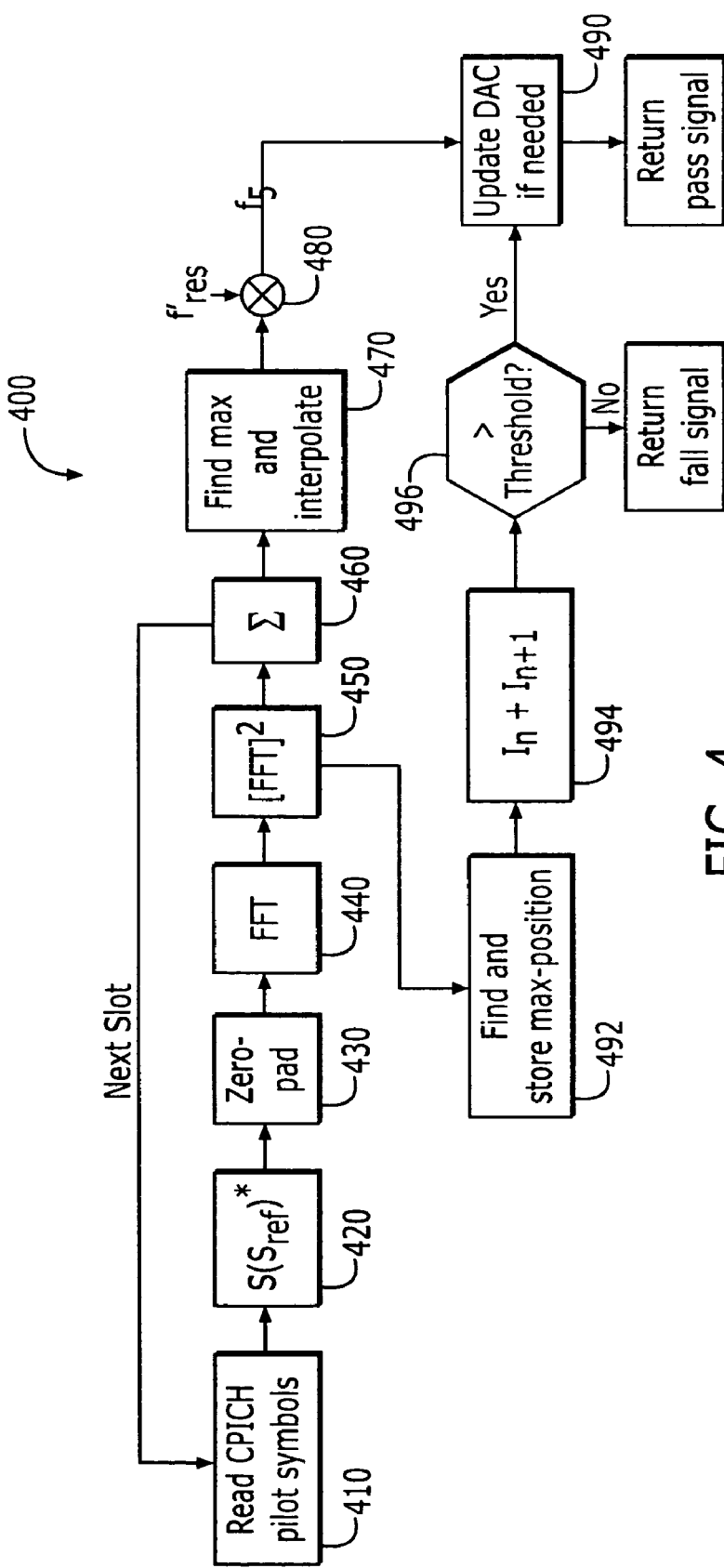
FIG. 4 is a block diagram that illustrates a conventional AFC-algorithm component that may be used in an AFC system when a frequency error is expected to be relatively large.

A mobile terminal may use different AFC algorithms depending on whether the frequency error is expected to be relatively large or small. Moreover, a frequency error estimate may be formed in multiple ways. One method is to form the estimates $X_k = S_k(\text{sref}^*_k)$, where $S_k$ denotes received symbols, $\text{sref}^*_k$ denotes known pilot symbol references, and * denotes complex conjugation. Successive values may be compared by forming $\Delta_k$=angle($x_k \cdot X^*_{k-1}$) where the angle of the complex number is determined based on the real and imaginary portions of the number representing points on horizontal and vertical axes, respectively. The result $\Delta_k$ is proportional to the frequency error or offset. In other embodiments, fast fourier transforms (FFTs) of the $X_k$ estimates may be computed as discussed above with respect to FIG. 4 to determine the frequency error or offset. Thus, the AFC-algorithm component 620 may be configured to implement multiple AFC algorithms and/or systems, such as, for example, those described above with reference to FIGS. 3 and 4

The estimates $x_k$ may be affected by disturbances due to imperfect transmission over the radio channel, which may be caused by noise and/or multipath fading. Conventional systems and methods may be used to compensate for these transmission disturbances. The intelligent conversion component 630 and the intelligent scheduling component 660 of FIG. 6 may be used to compensate for hardware imperfections in the mobile terminal, such as the quantization limitations of a DAC component and/or the effects of temperature on components, such as the VCXO.

Figure 2:
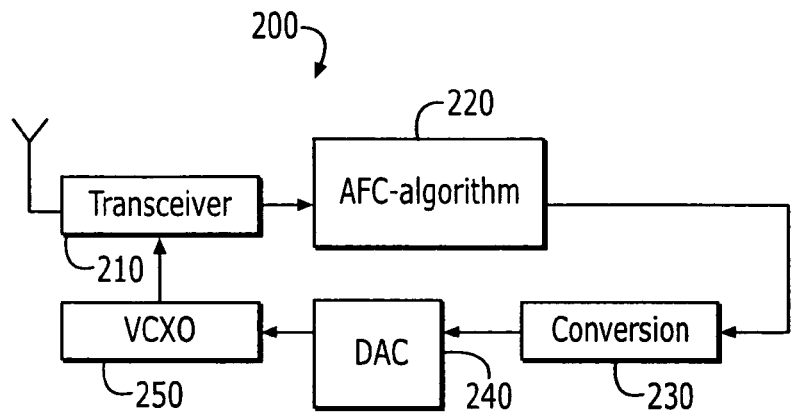
FIG. 2 is a block diagram that illustrates a conventional mobile terminal architecture.

Although FIGS. 5 and 6 illustrate an exemplary hardware and/or software architecture that may be used in devices that incorporate AFC systems, methods, and/or computer program products, it will be understood that the present invention is not limited to such a configuration but is intended to encompass any configuration capable of carrying out the operations described herein. It will be further appreciated that the functionality of any or all of the processing modules of FIGS. 2 and 3 may also be implemented using discrete hardware components, one or more application specific integrated circuits (ASICs), or a programmed digital signal processor or microcontroller.

The present invention is described hereinafter with reference to flowchart and/or block diagram illustrations of methods, electronic devices, and computer program products in accordance with some embodiments of the invention. These flowchart and/or block diagrams further illustrate exemplary operations of the mobile terminal architecture of FIGS. 5 and 6. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Figure 7:
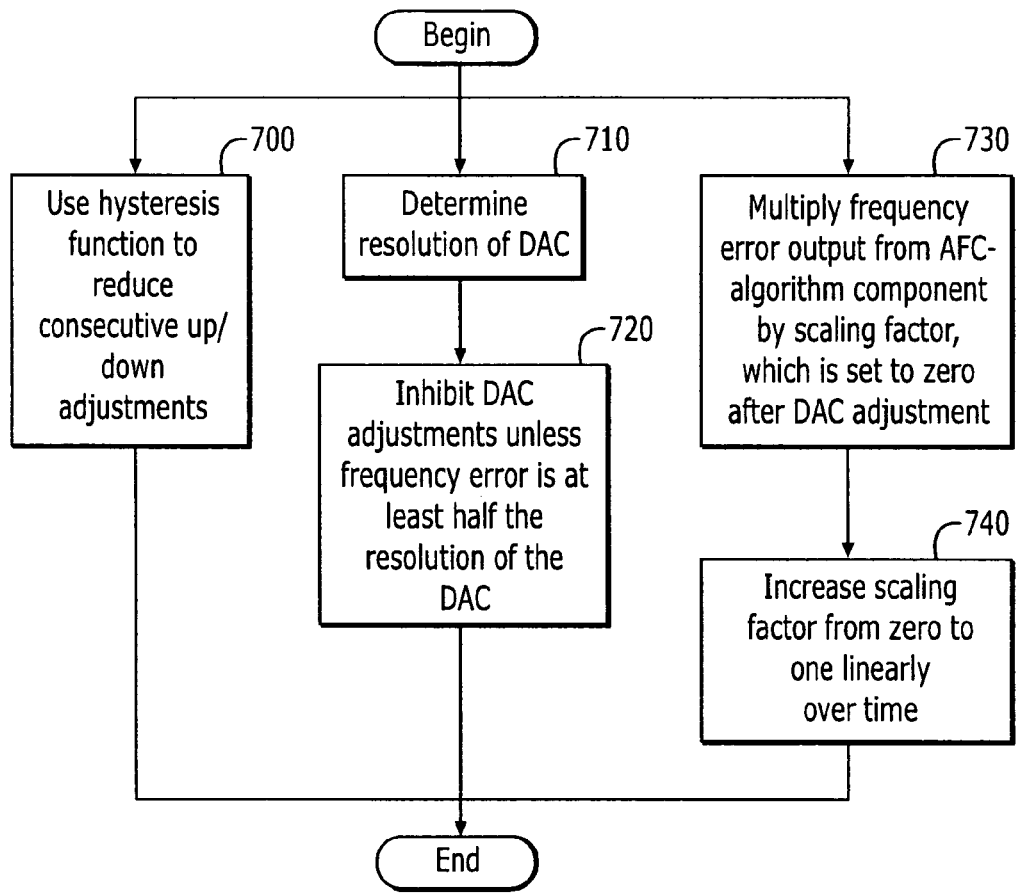
FIGS. 7 and 8 are flowcharts that illustrate operations for operating the AFC component of FIG. 6 in accordance with some embodiments of the present invention.

Referring now to FIG. 7, exemplary operations of, for example, the intelligent conversion component 630 of FIG. 6, in accordance with some embodiments of the present invention, will now be described. At block 700, the intelligent conversion component 630 may use a hysteresis function to reduce the number of consecutive up/down adjustments made to the input signal to the DAC 640. That is, two separate thresholds-a first threshold and a second threshold-are defined. The input signal to the DAC is not adjusted unless the frequency error signal exceeds the first threshold or falls below the second threshold. In accordance with some embodiments of the present invention, one threshold may be a positive threshold, which may represent a frequency error where the frequency output from the VCXO 650 needs to be increased, and the other threshold may be a negative threshold, which may represent a frequency error where the frequency output from the VCXO 650 needs to be decreased.

In additional embodiments of the present invention, the intelligent conversion component 630 may determine the resolution of the DAC 640 at block 710 and inhibit adjustments to the input signal of the DAC 640 at block 720 unless the frequency error is at least half the resolution of the DAC 640. That is, if the resolution of the DAC 640 is 80 Hz, then the input signal to the DAC 640 will not be adjusted unless the frequency error is at least 40 Hz or greater.

In further embodiments of the present invention, the intelligent conversion component 630 may multiply the frequency error output from the AFC-algorithm component by a scaling factor, which is set to zero after the DAC 640 has been adjusted at block 730. The scaling factor is linearly increased from zero to one over time at block 740. Blocks 730 and 740 active essentially as a filter with a time constant corresponding to the rate at which the scaling factor is increased at block 740 to prevent rapid changes to the DAC 640 input signal, which may cause rapid changes to the frequency generated by the VCXO 650.

Figure 8:
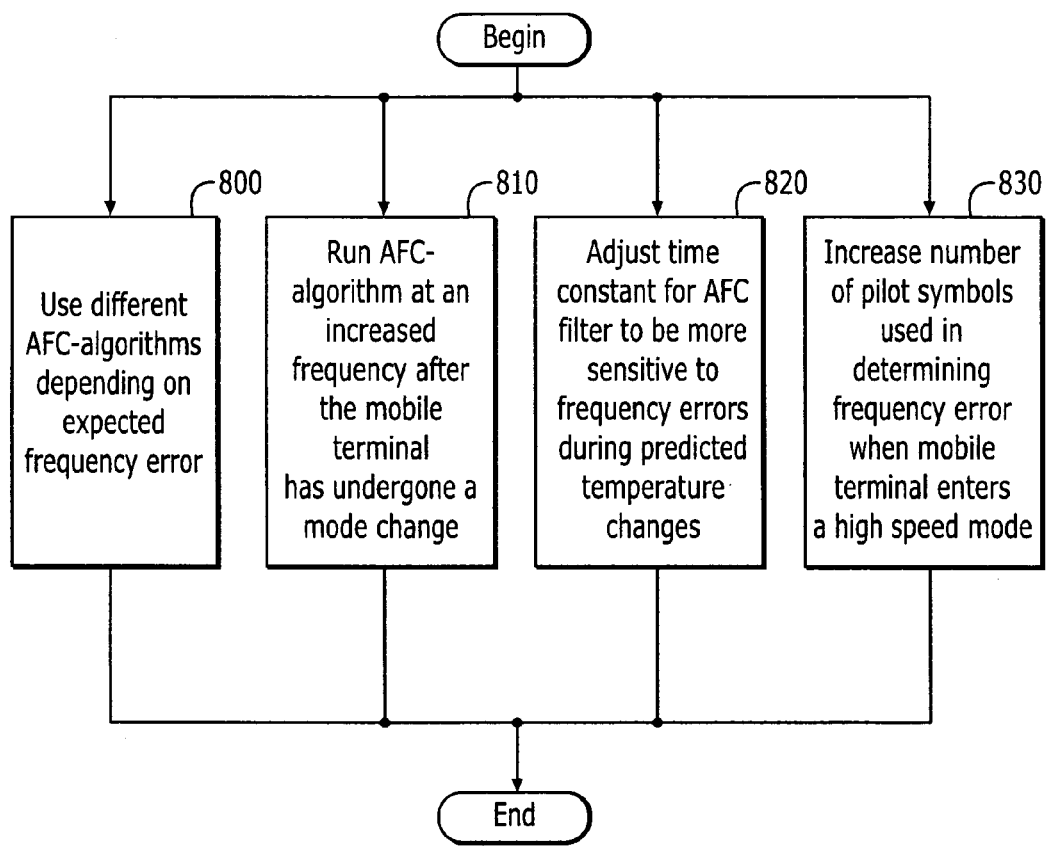

Referring now to FIG. 8, exemplary operations of, for example, the intelligent scheduling component 660 of FIG. 6, in accordance with some embodiments of the present invention, will now be described. At block 800, the intelligent scheduling component 660 may direct the AFC-algorithm component 620 to use specific AFC-algorithm depending on the expected frequency error. For example, the AFC-algorithm of FIG. 3 may be used when the expected frequency error is relatively small and the AFC-algorithm of FIG. 4 may be used when the expected frequency error is relatively large. At block 810, the intelligent scheduling component 660 may run the selected AFC-algorithm at an increased frequency after the mobile terminal has undergone a mode change, for example, when a temperature change can be predicted because the mobile terminal has just been turned on and/or when a temperature change can be predicted due to decreased radio activity. At block 820, the intelligent scheduling component 660 may adjust the time constant described with respect to blocks 730 and 740 of FIG. 7 to be more sensitive to frequency errors output from the AFC-algorithm component 620 during periods of predicted temperature changes as discussed in the foregoing. That is, when the mobile terminal is undergoing a temperature change of at least a minimum magnitude. At block 830, the intelligent scheduling component 660 may increase the number of pilot symbols used in determining the frequency error when the mobile terminal enters a high-speed mode.

Specifically, the high-speed mode may be assumed to have been entered when the absolute value of the frequency error is larger than a threshold value.

The flowcharts of FIGS. 7 and 8 illustrate the architecture, functionality, and operations of some embodiments of AFC systems, methods, and/or computer program products. In this regard, each block represents a module, segment, or portion of code, which comprises one or more executable instructions for implementing the specified logical function(s). It should also be noted that in other implementations, the function(s) noted in the blocks may occur out of the order noted in FIGS. 7 and 8. For example, two blocks shown in succession may, in fact, be executed substantially concurrently or the blocks may sometimes be executed in the reverse order, depending on the functionality involved.

Advantageously, embodiments of the present invention may be used to compensate for known implementation imperfections in the hardware controlling a VCXO in an electronic device, such as a mobile terminal. One example of such imperfections is the limited precision of a DAC and another example is frequency drift due to temperature variations in the component parts of the device. Embodiments of the present invention may reduce the number of frequency changes in the signal generated by the VCXO, which may improve overall system capacity.

Many variations and modifications can be made to the preferred embodiments without substantially departing from the principles of the present invention. All such variations and modifications are intended to be included herein within the scope of the present invention, as set forth in the following claims.

We claim:

1. A method of operating an automatic frequency control (AFC) system in an electronic device, comprising:
   using an AFC-algorithm component to determine a frequency error corresponding to a difference between a frequency of a signal output from a signal generator and a received signal frequency;
   multiplying the frequency error determined by the AFC-algorithm component by a scaling factor, which is set to zero after an adjustment has been made to change a frequency of the signal output from the signal generator;
   increasing the scaling factor from zero to one over time; and
   using the scaled frequency error to determine whether to adjust the frequency of the signal output from the signal generator.

2. The method of claim 1, wherein increasing the scaling factor comprises:
   linearly increasing the scaling factor from zero to one over time.

3. The method of claim 1, wherein the signal generator is responsive to an output signal from a digital-analog-converter (DAC) and the DAC is responsive to the scaled frequency error, the method further comprising:
   determining the resolution of the DAC in terms of frequency change in the output signal of the signal generator; and
   inhibiting the adjustments to the frequency of the signal output from the signal generator if the scaled frequency error is less than half the resolution of the DAC.

4. The method of claim 1, wherein using the scaled frequency error comprises:
   applying a hysteresis function to the scaled frequency error to determine whether to adjust the frequency of the signal output from the signal generator.

5. The method of claim 1, further comprising:
   selecting the AFC-algorithm component from a plurality of AFC-algorithm components based on an expected value for the frequency error.

6. The method of claim 5, further comprising:
   running the selected AFC-algorithm component at an increased frequency if the electronic device has undergone a mode change such that a temperature of the electronic device changes at least a minimum magnitude.

7. The method of claim 1, wherein increasing the scaling factor from zero to one over time comprises:
   determining if the electronic device is undergoing a temperature change of at least a minimum magnitude; and
   increasing the scaling factor from zero to one over a first time period if the electronic device is undergoing a temperature change of at least the minimum magnitude and a second time period, longer than the first time period if the electronic device is not undergoing a temperature change of at least the minimum magnitude.

8. The method of claim 1, wherein the electronic device is a mobile terminal, the method further comprising:
   increasing a number of pilot symbols used by the AFC-algorithm component if the mobile terminal enters a high-speed mode indicated by an absolute value of the frequency error exceeding a threshold.

9. An electronic device, comprising:
   an automatic frequency control (AFC) system, the AFC system comprising:
   means for using an AFC-algorithm component to determine a frequency error corresponding to a difference between a frequency of a signal output from a signal generator and a received signal frequency;
   means for multiplying the frequency error determined by the AFC-algorithm component by a scaling factor, which is set to zero after an adjustment has been made to change a frequency of the signal output from the signal generator;
   means for increasing the scaling factor from zero to one over time; and
   means for using the scaled frequency error to determine whether to adjust the frequency of the signal output from the signal generator.

10. The electronic device of claim 9, wherein the means for increasing the scaling factor comprises:
    means for linearly increasing the scaling factor from zero to one over time.

11. The electronic device of claim 9, wherein the signal generator is responsive to an output signal from a digital-analog-converter (DAC) and the DAC is responsive to the scaled frequency error, the electronic device further comprising:
    means for determining the resolution of the DAC in terms of frequency change in the output signal of the signal generator; and
    means for inhibiting the adjustments to the frequency of the signal output from the signal generator if the scaled frequency error is less than half the resolution of the DAC.

12. The electronic device of claim 9, wherein the means for using the scaled frequency error comprises:
    means for applying a hysteresis function to the scaled frequency error to determine whether to adjust the frequency of the signal output from the signal generator.

13. The electronic device of claim 9, further comprising:
means for selecting the AFC-algorithm component from a plurality of AFC-algorithm components based on an expected value for the frequency error.

14. The electronic device of claim 13, further comprising:
means for running the selected AFC-algorithm component at an increased frequency if the electronic device has undergone a mode change such that a temperature of the electronic device changes at least a minimum magnitude.

15. The electronic device of claim 9, wherein the means for increasing the scaling factor from zero to one over time comprises:
means for determining if the electronic device is undergoing a temperature change of at least a minimum magnitude; and
means for increasing the scaling factor from zero to one over a first time period if the electronic device is undergoing a temperature change of at least the minimum magnitude and a second time period, longer than the first time period if the electronic device is not undergoing a temperature change of at least the minimum magnitude.

16. The electronic device of claim 9, wherein the electronic device is a mobile terminal, the AFC system further comprising:
means for increasing a number of pilot symbols used by the AFC-algorithm component if the mobile terminal enters a high-speed mode indicated by an absolute value of the frequency error exceeding a threshold.

17. A computer program product for operating an automatic frequency control (ALFC) system in an electronic device, comprising:
a computer readable storage medium having computer readable program code embodied therein, the computer readable program code comprising:
computer readable program code configured to use an AFC-algorithm component to determine a frequency error corresponding to a difference between a frequency of a signal output from a signal generator and a received signal frequency;
computer readable program code configured to multiply the frequency error determined by the AFC-algorithm component by a scaling factor, which is set to zero after an adjustment has been made to change a frequency of the signal output from the signal generator;
computer readable program code configured to increase the scaling factor from zero to one over time; and
computer readable program code configured to use the scaled frequency error to determine whether to adjust the frequency of the signal output from the signal generator.

18. The computer program product of claim 17, wherein the computer readable program code configured to increase the scaling factor comprises:
computer readable program code configured to linearly increase the scaling factor from zero to one over time.

19. The computer program product of claim 17, wherein the signal generator is responsive to an output signal from a digital-analog-converter (DAC) and the DAC is responsive to the scaled frequency error, the computer program product further comprising:
computer readable program code configured to determine the resolution of the DAC in terms of frequency change in the output signal of the signal generator; and
computer readable program code configured to inhibit the adjustments to the frequency of the signal output from the signal generator if the scaled frequency error is less than half the resolution of the DAC.

20. The computer program product of claim 17, wherein the computer readable program code configured to use the scaled frequency error comprises:
computer readable program code configured to apply a hysteresis function to the scaled frequency error to determine whether to adjust the frequency of the signal output from the signal generator.

21. The computer program product of claim 17, further comprising:
computer readable program code configured to select the AFC-algorithm component from a plurality of AFC-algorithm components based on an expected value for the frequency error.

22. The computer program product of claim 21, further comprising:
computer readable program code configured to run the selected AFC-algorithm component at an increased frequency if the electronic device has undergone a mode change such that a temperature of the electronic device changes at least a minimum magnitude.

23. The computer program product of claim 17, wherein the computer readable program code configured to increase the scaling factor from zero to one over time comprises:
computer readable program code configured to determine if the electronic device is undergoing a temperature change of at least a minimum magnitude; and
computer readable program code configured to increase the scaling factor from zero to one over a first time period if the electronic device is undergoing a temperature change of at least the minimum magnitude and a second time period, longer than the first time period if the electronic device is not undergoing a temperature change of at least the minimum magnitude.

24. The computer program product of claim 17, wherein the electronic device is a mobile terminal, the computer program product further comprising:
computer readable program code configured to increasing a number of pilot symbols used by the AFC-algorithm component if the mobile terminal enters a high-speed mode indicated by an absolute value of the frequency error exceeding a threshold.

* * * * *